(12) United States Patent
Derner et al.

(10) Patent No.: US 11,264,394 B2
(45) Date of Patent: Mar. 1, 2022

(54) INTEGRATED COMPONENTS WHICH HAVE BOTH HORIZONTALLY-ORIENTED TRANSISTORS AND VERTICALLY-ORIENTED TRANSISTORS

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/083,208

(22) Filed: Oct. 28, 2020

(65) Prior Publication Data
US 2021/0074714 A1    Mar. 11, 2021

Related U.S. Application Data

(62) Division of application No. 16/379,365, filed on Apr. 9, 2019, now Pat. No. 10,854,617.

(51) Int. Cl.
| | |
|---|---|
| H01L 27/11507 | (2017.01) |
| H01L 23/528 | (2006.01) |
| H01L 29/08 | (2006.01) |
| H01L 29/78 | (2006.01) |
| H01L 27/11514 | (2017.01) |
| H01L 27/108 | (2006.01) |
| H01L 27/02 | (2006.01) |
| H01L 49/02 | (2006.01) |

(52) U.S. Cl.
CPC ...... *H01L 27/11507* (2013.01); *H01L 23/528* (2013.01); *H01L 27/108* (2013.01); *H01L 27/11514* (2013.01); *H01L 29/0847* (2013.01); *H01L 29/78* (2013.01); *H01L 29/7827* (2013.01); *H01L 27/0207* (2013.01); *H01L 28/75* (2013.01)

(58) Field of Classification Search
CPC ............ H01L 21/11507; H01L 27/108; H01L 23/528; H01L 27/11514; H01L 29/0847; H01L 29/78; H01L 29/7827; H01L 27/11507; H01L 27/0207
USPC ..... 257/295.296, 298; 438/3, 238, 239, 386, 438/399
See application file for complete search history.

(56) References Cited

U.S. PATENT DOCUMENTS 9,842,839 B1 * 12/2017 Sills et al. .......... H01L 27/1082
10,056,386 B2    8/2018 Mathew et al.
(Continued)

*Primary Examiner* — Thinh T Nguyen
(74) *Attorney, Agent, or Firm* — Wells St. John P.S.

(57) ABSTRACT

Some embodiments include an integrated assembly. The integrated assembly has a first transistor with a horizontally-extending channel region between a first source/drain region and a second source/drain region; has a second transistor with a vertically-extending channel region between a third source/drain region and a fourth source/drain region; and has a capacitor between the first and second transistors. The capacitor has a first electrode, a second electrode, and an insulative material between the first and second electrodes. The first electrode is electrically connected with the first source/drain region, and the second electrode is electrically connected with the third source/drain region. A digit line is electrically connected with the second source/drain region. A conductive structure is electrically connected with the fourth source/drain region.

6 Claims, 12 Drawing Sheets

(56) References Cited

U.S. PATENT DOCUMENTS

| | | |
|---|---|---|
| 10,079,235 B2 | 9/2018 | Mathew et al. |
| 10,083,973 B1 | 9/2018 | Matsubara |
| 10,153,281 B2 | 12/2018 | Demer et al. |
| 10,157,926 B2 | 12/2018 | Yang |
| 10,163,480 B1 | 12/2018 | Kawamura et al. |
| 2002/0044477 A1 | 4/2002 | Takeuchi |
| 2004/0232497 A1 | 11/2004 | Akiyama et al. |
| 2018/0061837 A1 | 3/2018 | Mathew et al. |
| 2020/0051982 A1 | 2/2020 | Derner |
| 2020/0052070 A1 | 2/2020 | Derner |
| 2020/0327926 A1 | 10/2020 | Bedeschi et al. |

\* cited by examiner

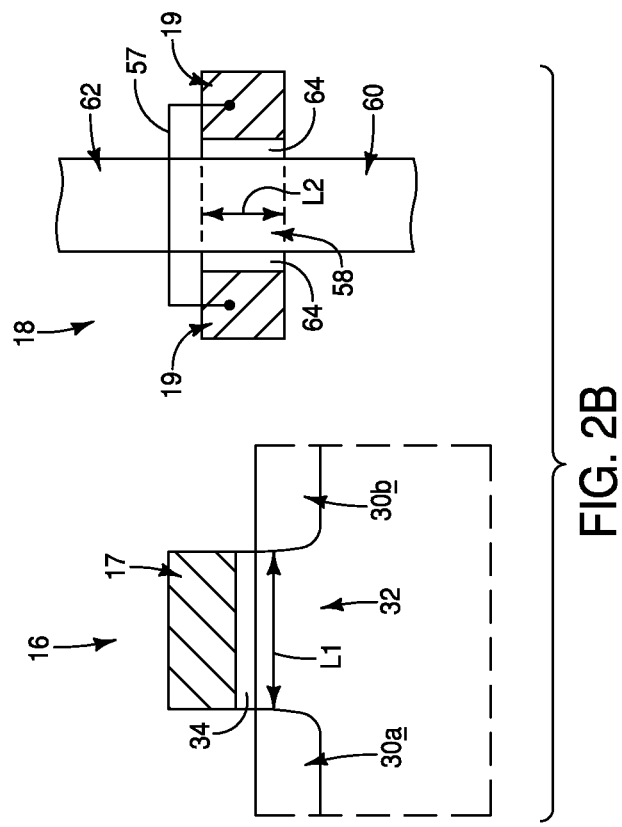
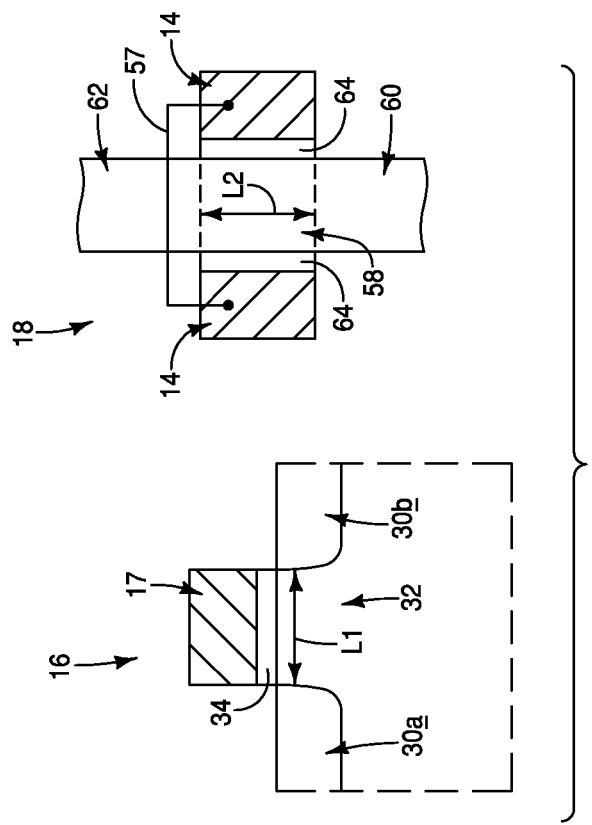
FIG. 2A
FIG. 2B

INTEGRATED COMPONENTS WHICH HAVE BOTH HORIZONTALLY-ORIENTED TRANSISTORS AND VERTICALLY-ORIENTED TRANSISTORS

RELATED PATENT DATA

This patent resulted from a divisional of U.S. patent application Ser. No. 16/379,365, which was filed Apr. 9, 2019 and which is hereby incorporated by reference herein.

TECHNICAL FIELD

Integrated components which have both horizontally-oriented transistors and vertically-oriented transistors.

BACKGROUND

A continuing goal is to achieve ever-increasing levels of integration of integrated memory. A related goal is to increase the packing density of memory components. It is also desired to develop integrated memory having strong signal, good durability over a large number of read/write cycles, fast access rates, protection against cell-to-cell disturb mechanisms, etc.

An example memory device is a two-transistor-one-capacitor (2T-1C) device. An example prior art 2T-1C memory cell configuration is schematically illustrated in FIG. 1 as a device 2. The 2T-1C memory cell includes two transistors (T1 and T2), and a capacitor (CAP) between the transistors. Each of the transistors comprises a gate. The gates are electrically coupled to one another, and are also electrically coupled to a wordline (WL). The transistors have source/drain regions coupled with comparative bitlines (BL-1 and BL-2). The bitlines are coupled with a sense amplifier 4 configured to compare electrical properties (e.g., voltage) of the comparative bitlines to one another.

The 2T-1C memory cell may have many attractive features, including high signal strength, reduced cell-to-cell disturb mechanisms, good refresh, etc. However, difficulties are encountered in fabricating highly-integrated memory comprising 2T-1C devices.

Another example memory device is a ferroelectric memory device utilizing a ferroelectric capacitor for memory/storage. For instance, ferroelectric capacitors may be incorporated into ferroelectric random access memory (FeRAM). FeRAM may have many attractive features, including nonvolatility, low power consumption, high-speed operation, etc. However, difficulties are encountered in fabricating highly-integrated memory comprising FeRAM.

It is desired to develop improved memory devices, and to develop improved memory arrays incorporating such devices.

BRIEF DESCRIPTION OF THE DRAWINGS

FIG. 2A is a diagrammatic cross-sectional side view of an example relationship between a transistor with a horizontally-extending channel region and a transistor with a vertically-extending channel region relative to the 2T-1C memory devices of FIG. 2.

FIG. 2B is a diagrammatic cross-sectional side view of another example relationship between a transistor with a horizontally-extending channel region and a transistor with a vertically-extending channel region relative to the 2T-1C memory devices of FIG. 2.

DETAILED DESCRIPTION OF THE ILLUSTRATED EMBODIMENTS

Some embodiments include a memory device having a capacitor between a first transistor and a second transistor. The first transistor has a horizontally-extending channel region; and the second transistor has a vertically-extending channel region. The memory device may be a two-transistor-one-capacitor (2T-1C) memory device or a ferroelectric memory device. Some embodiments include memory arrays comprising 2T-1C memory devices or ferroelectric memory devices. In some embodiments, neighboring memory devices may share a connection to a digit line. Example embodiments are described with reference to FIGS. 2-11.

Figure 2:
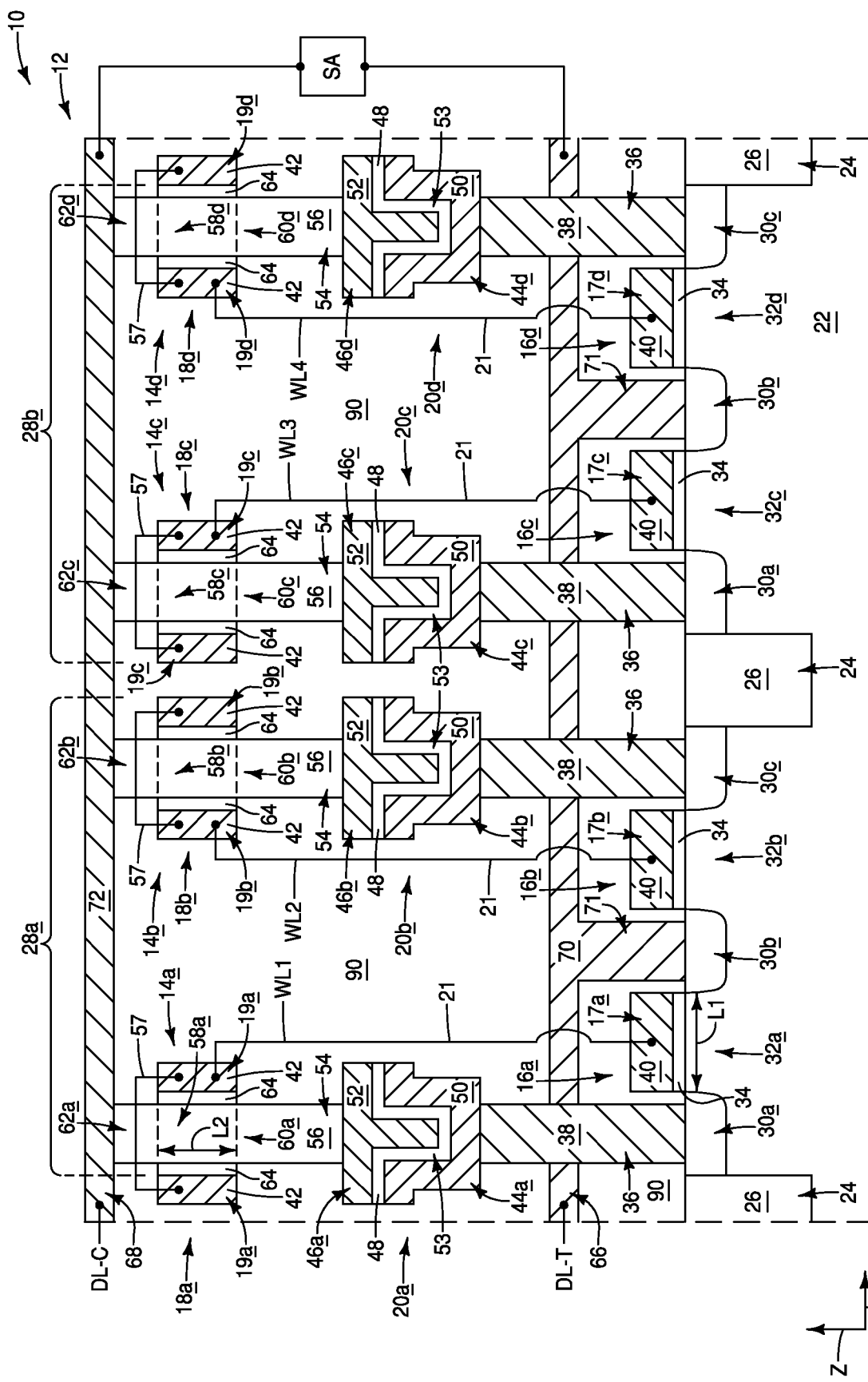
FIG. 2 is a diagrammatic cross-sectional side view of a region of an example integrated assembly comprising example 2T-1C memory devices.

Referring to FIG. 2, an example integrated assembly 10 includes a memory array 12 which comprises memory cells (devices, components) 14. The individual memory cells are labeled as 14a-d so that they may be distinguished from one another.

Each of the memory cells includes a first transistor 16, a second transistor 18, and a capacitor 20 between the first and second transistors. The first transistors of each of the memory cells are labeled 16a-d so that they may be distinguished from one another, the second transistors of each of the memory cells are labeled 18a-d so that they may be distinguished from one another, and the capacitors of each of the memory cells are labeled 20a-d so that they may be distinguished from one another.

Figure 1:
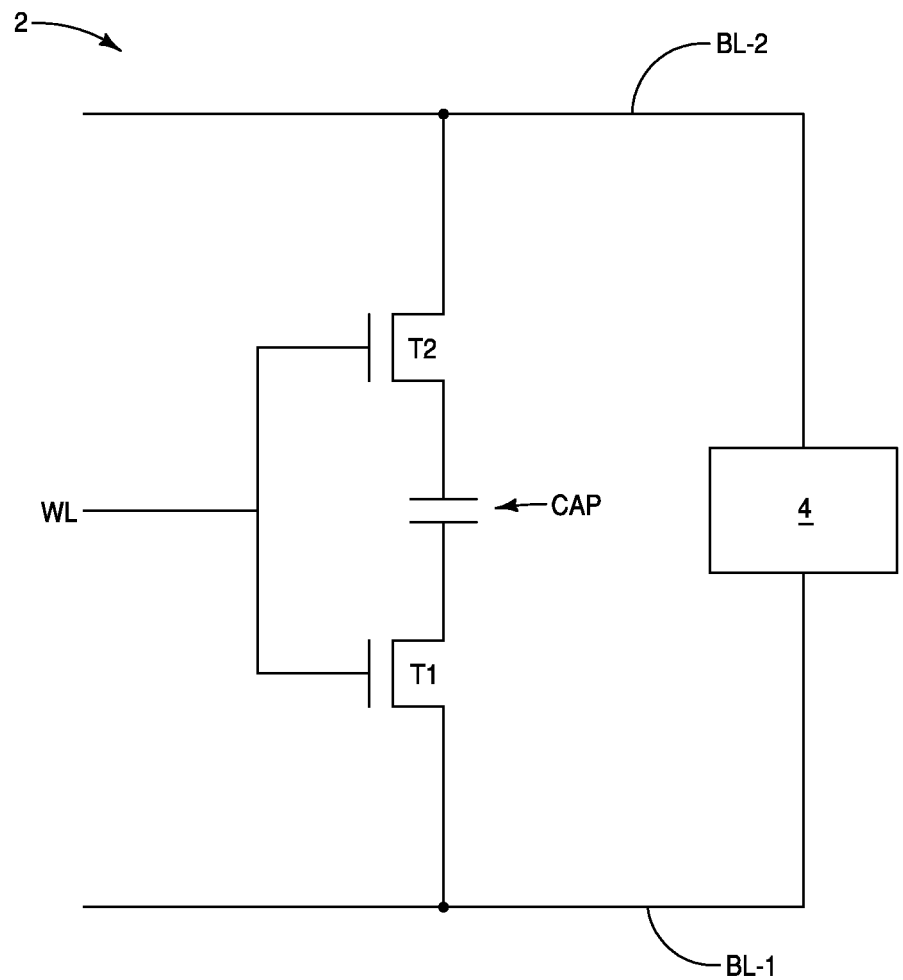
FIG. 1 is a diagrammatic schematic illustration of a prior art assembly comprising a two-transistor-one-capacitor (2T-1C) memory device.

Within each memory cell 14, the transistor 16 may correspond to the T1 transistor FIG. 1, the transistor 18 may correspond to the T2 transistor of FIG. 1, and the capacitor 20 may correspond to the capacitor CAP of FIG. 1.

The transistors 16 comprise transistor gates 17 (with the gates 17 of the memory cells 14a-d being labeled as 17a-d so that they may be distinguished from one another).

The transistors 18 comprise gates 19 (with the gates 19 of the memory cells 14a-d being labeled as 19a-b so that they may be distinguished from one another).

The transistor gates 19 of the second transistors 18 are coupled with the transistor gates 17 of the first transistors 16, as is diagrammatically illustrated with electrical connections 21. The combined gates 17/19 would be electrically coupled with wordlines, as is diagrammatically illustrated with wordlines WL1-WL4 being electrically coupled to the combinations 17a/19a, 17b/19b, 17c/19c and 17d/19d, respectively, through the electrical connections 21.

The transistor gates 17 comprise conductive material 40, and the transistor gates 19 comprise conductive material 42. The conductive materials 40 and 42 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 40 and 42 may comprise a same composition as one another, or may comprise different compositions relative to one another.

The transistors 16 are supported by a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

Insulative regions 24 extend into the base 22. The insulative regions 24 comprise insulative material 26. Such insulative material may comprise any suitable composition(s); and in some embodiments may comprise, consist essentially of, or consist of one or both of silicon dioxide and silicon nitride. In some embodiments, the insulative regions 24 may correspond to shallow trench isolation (STI).

In some embodiments, the memory cells 14 may be considered to be arranged in pairs (i.e., to be in paired arrangements), with each memory cell pair comprising two of the first transistors 16, and a source/drain region shared between the two first transistors. For instance, the memory cells 14a and 14b may be considered to be in a first paired arrangement 28a. The paired memory cells 14a and 14b comprise the transistors 16a and 16b. The transistor 16a includes first and second source/drain regions 30a and 30b which extend into the semiconductor base 22, and which are on opposing sides of the transistor gate 17a along the cross-section of FIG. 2. The transistor 16b shares the source/drain region 30b with the transistor 16a, and has another source/drain region 30c on an opposing side of the gate 17b relative to the source/drain region 30b. The memory cells 14c and 14d are in a similar paired relationship as the memory cells 14a and 14b, and also comprise three source/drain regions 30a, 30b and 30c, with the middle region 30b being shared between the transistors 16c and 16d.

The transistor gates 16 are over channel regions 32 and are spaced from such channel regions by intervening gate dielectric material 34. The channel regions are labeled 32a-d so that they may be distinguished from one another.

The gate dielectric material 34 may comprise any suitable composition(s); and in some embodiments may comprise, consist essentially of, or consist of silicon dioxide.

The channel regions 32 extend horizontally, and specifically extend along an illustrated y-axis. The channel regions 32 may be considered to have lengths along the horizontal axis (the illustrated y-axis), with an example length L1 being shown relative to the channel region 32a.

Conductive extensions 36 extend upwardly from the source/drain regions 30a and 30c. The conductive extensions may be considered to extend vertically, and specifically to extend along an illustrated z-axis.

The conductive extensions 36 comprise conductive material 38. The conductive material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The capacitors 20 have first electrodes 44 adjacent the conductive extensions 36, and electrically coupled with the source/drain regions 30a and 30c through the conductive extensions 36. The capacitors 20 have second electrodes 46 proximate the first electrodes 44 and spaced from the first electrodes by intervening insulative material 48. The first electrodes 44 are labeled 44a-d so that they may be distinguished from one another; and similarly the second electrodes 46 are labeled 46a-d so that they may be distinguished from one another.

The first and second electrodes 44 and 46 comprise conductive materials 50 and 52, respectively. The conductive materials 50 and 52 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive materials 50 and 52 may comprise a same composition as one another. In other embodiments, the conductive materials 50 and 52 may comprise different compositions relative to one another.

The insulative material 48 may comprise any suitable composition(s); and in some embodiments may comprise one or more of silicon dioxide, silicon oxynitride, high-k materials, etc. (with the term high-k meaning a dielectric constant greater than that of silicon dioxide). The insulative material 48 may be referred to as a capacitor dielectric material.

The capacitors 20 may have any suitable configuration. In the illustrated embodiment, the first electrodes 44 are under the second electrodes 48. Accordingly, the first and second electrodes 44 and 48 may be referred to as lower and upper electrodes (or as bottom and top electrodes), respectively. The lower electrodes 44 are configured as container-shaped structures having upwardly-opening containers 53 therein. In the shown embodiment, the insulative material 48 and the upper electrode material 52 extend into the upwardly-opening containers 53.

Semiconductor pillars 54 extend upwardly from the second electrodes 52, and in the illustrated embodiment extend vertically (i.e., extend along the illustrated z-axis). The semiconductor pillars 54 comprise semiconductor material 56. The semiconductor material 56 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). For instance, the semiconductor material 56 may comprise monocrystalline silicon and/or polycrystalline silicon.

The gates 19 of the transistors 18 are along the vertically-extending semiconductor pillars 54. The transistors 18 have channel regions 58 within the pillars 54, and have source/drain regions 60 and 62 on opposing sides of the channel regions 58. Dashed-lines are provided to diagrammatically illustrate approximate boundaries between the channel regions 58 and the source/drain regions 60, 62. The channel regions 58 are labeled 58a-d so that they may be distinguished from another; and the source/drain regions 60, 62 are labeled 60a-d, 62a-d so that they may be distinguished.

Each of the transistors 18 appears to have two gates 19 on opposing sides of the semiconductor pillars 54 along the cross-section of FIG. 2. In practice, the gates 19 of each transistor 18 would be electrically coupled to one another, as is diagrammatically illustrated with electrical connections 57.

The transistor gates 19 are spaced from the channel regions 58 by gate dielectric material 64. The gate dielectric material 64 may comprise any suitable composition(s); and in some embodiments may comprise, consist essentially of, or consist of silicon dioxide.

The channel regions 58 extend vertically (i.e., extend along the illustrated z-axis). The channel regions 58 may be considered to have vertical lengths, with an example length L2 being shown relative to the channel region 58a.

The relative sizes of the horizontally-extending channel regions 32 and the vertically-extending channel regions 58 may be tailored for particular applications. For instance, FIG. 2A diagrammatically illustrates an application in which the length L1 of the horizontally-extending channel region 32 is about the same as the length L2 of the vertically-extending channel region 58; and FIG. 2B diagrammatically illustrates an application in which the lengths L1 and L2 are different relative to one another (and specifically in which the length L2 is smaller than the length L1).

In some embodiments, the source/drain regions 30a and 30b of the first transistor 16a may be considered to be first and second source/drain regions within the memory cell 14a; and the source/drain regions 60a and 62a of the second transistor 18a may be considered to be third and fourth source/drain regions within the memory cell 14a. The first and third source/drain regions 30a and 60a are electrically coupled with the first and second electrodes 44a and 46a, respectively, of the capacitor 20a.

The second source/drain region 30b is electrically coupled with a digit line 66, and the fourth source/drain region 62a is electrically coupled with a conductive structure 68.

The digit line 66 comprises conductive material 70, and the conductive structure 68 comprises conductive material 72. The conductive materials 70 and 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The materials 70 and 72 may be the same composition as one another, or may be different compositions relative to one another.

The memory cells 14a and 14b within the paired set (i.e., paired arrangement) 28a share a digit line connection 71 to the digit line 66, with such connection being coupled with the shared source/drain region 30b. Similarly, the memory cells 14c and 14d within the paired set 28b share a digit line connection 71 to the digit line 66.

In the illustrated 2T-1C memory cell 14a, the digit line 66 corresponds to a first comparative digit line DL-T and the conductive structure 68 corresponds to a second comparative digit line DL-C. The comparative digit lines DL-T and DL-C extend to sense amplifier circuitry SA which may be configured to compare electrical properties (e.g., voltage) of the two to ascertain a memory state of memory cell 14a. The comparative digit lines DL-T and DL-C may be considered to be a paired set (DL-1/DL-C) which comprises a true digit line (DL-T) and a complementary digit line (DL-C). The terms "true" and "complementary" are arbitrary. The electrical values of the true and complementary digit lines of the paired set are utilized together during reading/writing operations of memory cells (e.g., the memory cell 14a) associated with such set.

The digit lines DL-1C and DL-1T may be considered to be comparatively coupled to one another through the sense amplifier SA. For purposes of understanding this disclosure and the claims that follow, a first digit line is "comparatively coupled" with a second digit line through a sense amplifier if the sense amplifier is configured to compare electrical properties (e.g., voltage) of the first and second digit lines with one another.

In the illustrated arrangement of FIG. 2, the paired arrangement 28a may be considered to comprise a first 2T-1C memory device 14a and a second 2T-1C memory device 14b. The first memory device 14a includes a first transistor 16a having a horizontally-extending channel region 32a, a second transistor 18a having a vertically-extending channel region 58a, and a first capacitor 20a between the first and second transistors 16a, 18a. The second memory device 14b includes a third transistor 16b having a horizontally-extending channel region 32b, a fourth transistor 18b having a vertically-extending channel region 58b, and a second capacitor 20b between the third and fourth transistors 16b, 18b.

The first transistor 16a has first and second source/drain regions 30a and 30b on opposing sides of its channel region 32a; the second transistor 18a has third and fourth source/drain regions 60a and 62a on opposing sides of its channel region 58a; the third transistor 16b has the second source/drain region 30b on one side of its channel region 32b and has a fifth source/drain region 30c on another side of its channel region opposing the second source/drain region 30b; and the fourth transistor 18b has sixth and seventh source/drain regions 60b and 62b on opposing sides of its channel region 58b.

The first and fifth source/drain regions 30a and 30c are electrically coupled with the bottom electrodes 44a and 44b of the first and second capacitors 20a and 20b, respectively. The third and sixth source/drain regions 60a and 60b are electrically coupled with the top electrodes 46a and 46b of the first and second capacitors 20a and 20b, respectively. The top and bottom electrodes 46a/46a, 44b/46b of the first and second capacitors 20a, 20b are spaced from one another by the dielectric material 48. In some embodiments, the dielectric material 48 of the first capacitor 20a may be referred to as first dielectric material, and the dielectric material 48 of the second capacitor 20b may be referred to as second dielectric material.

The first comparative digit line DL-T is electrically connected with the second source/drain region 30b; and the second comparative digit line DL-C is electrically connected with the fourth and seventh source/drain regions 62a and 62b.

The paired arrangement 28b has a similar configuration as that described above relative to the paired arrangement 28a; but utilizing the memory cells 14c and 14d instead of the memory cells 14a and 14b.

The memory cells 14a-14d may be considered to be substantially identical to one another; and may be considered to be representative of a large number of substantially identical memory cells which may be utilized in the memory array 12 (with the term "substantially identical" meaning identical to within result tolerances of fabrication and measurement). For instance, the memory array 12 may comprise hundreds, thousands, hundreds of thousands, millions, hundreds of millions, etc., of the 2T-1C memory cells.

Insulative material 90 may extend between the memory cells 14a-d, under the comparative digit line DL-T and over the comparative digit line DL-C (although the insulative material 90 is not shown over the digit line DL-C in order to simplify the drawing). Such insulative material may comprise any suitable composition(s), such as, for example, silicon dioxide.

Figure 3:
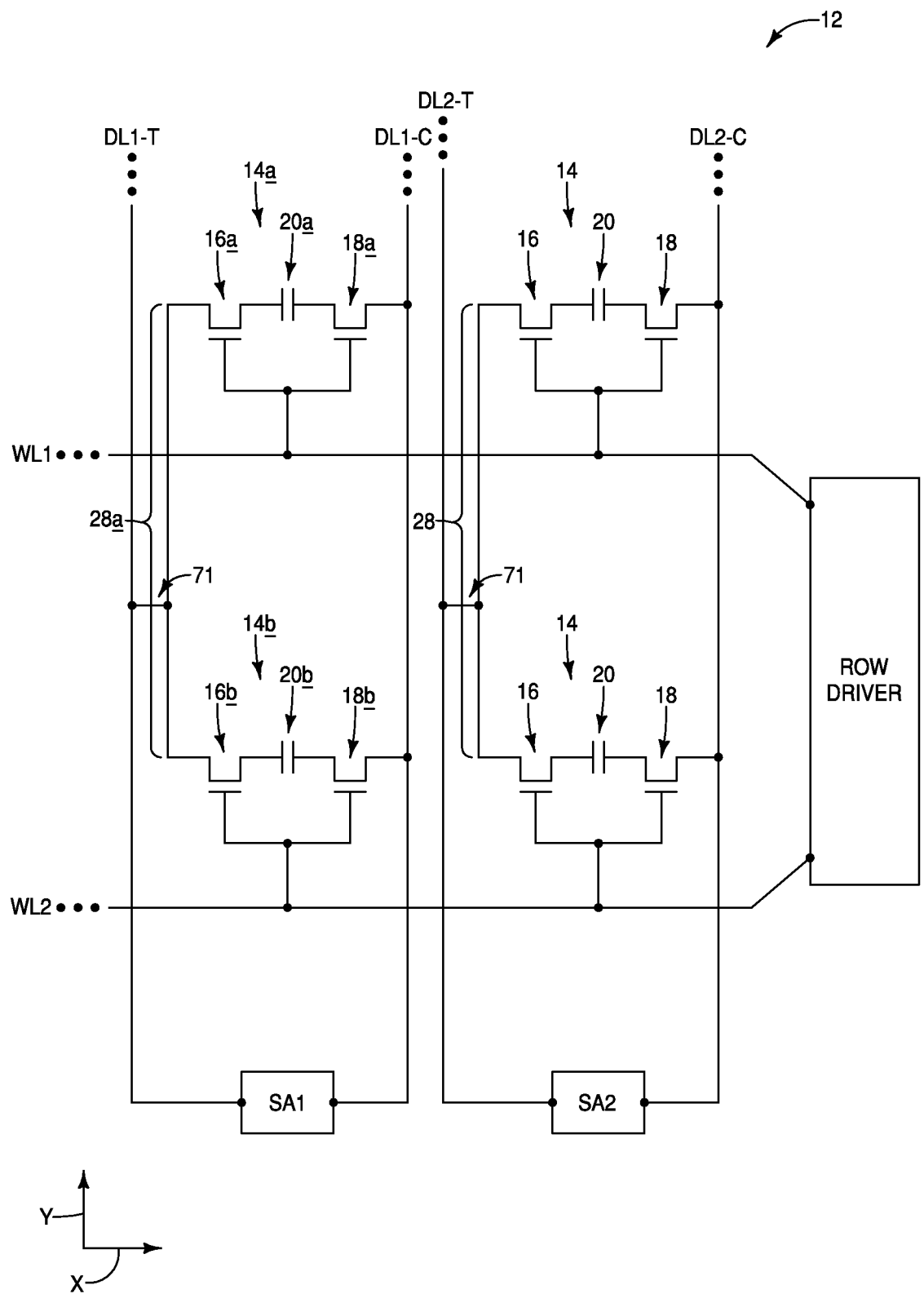
FIG. 3 is a diagrammatic schematic illustration of regions of an example assembly comprising a memory array with 2T-1C memory devices.

FIG. 3 schematically illustrates a region of the example memory array 12 comprising several of the memory cells 14. The memory cells are in paired arrangements 28, with paired memory cells of each arrangement 28 sharing a digit line connection 71. Two of the memory cells are labeled as 14a and 14b. The memory cells 14a and 14b are in the paired arrangement 28a described above with reference to FIG. 2.

Each of the memory cells 14 comprises the transistors 16 and 18, and the capacitor 20 between the transistors 16 and 18. The gates of the transistors 16 and 18 are tied to wordlines WL1 and WL2 which extend to row driver circuitry (also referred to as wordline driver circuitry).

The memory cells 14 are coupled with digit line pairs which include a first comparative digit line (DL-T) and a second comparative digit line (DL-C). In the illustrated embodiment, a first digit line pair includes the comparative digit lines DL1-T and DL1-C; and a second digit line pair includes the comparative digit lines DL2-T and DL2-C. The digit line pairs extend to sense amplifiers (SA1, SA2) configured to compare digit lines of the digit line pairs with one another. Each of the memory cells 14 is uniquely addressed through a digit line pair and a wordline.

The digit lines (e.g., DL1-T/DL1-C) may be considered to extend along columns of the memory array 12, and the wordlines (e.g., WL1) may be considered to extend along rows of the memory array; with the rows extending along the illustrated x-axis, and the columns extended along the illustrated y-axis.

Figure 4:
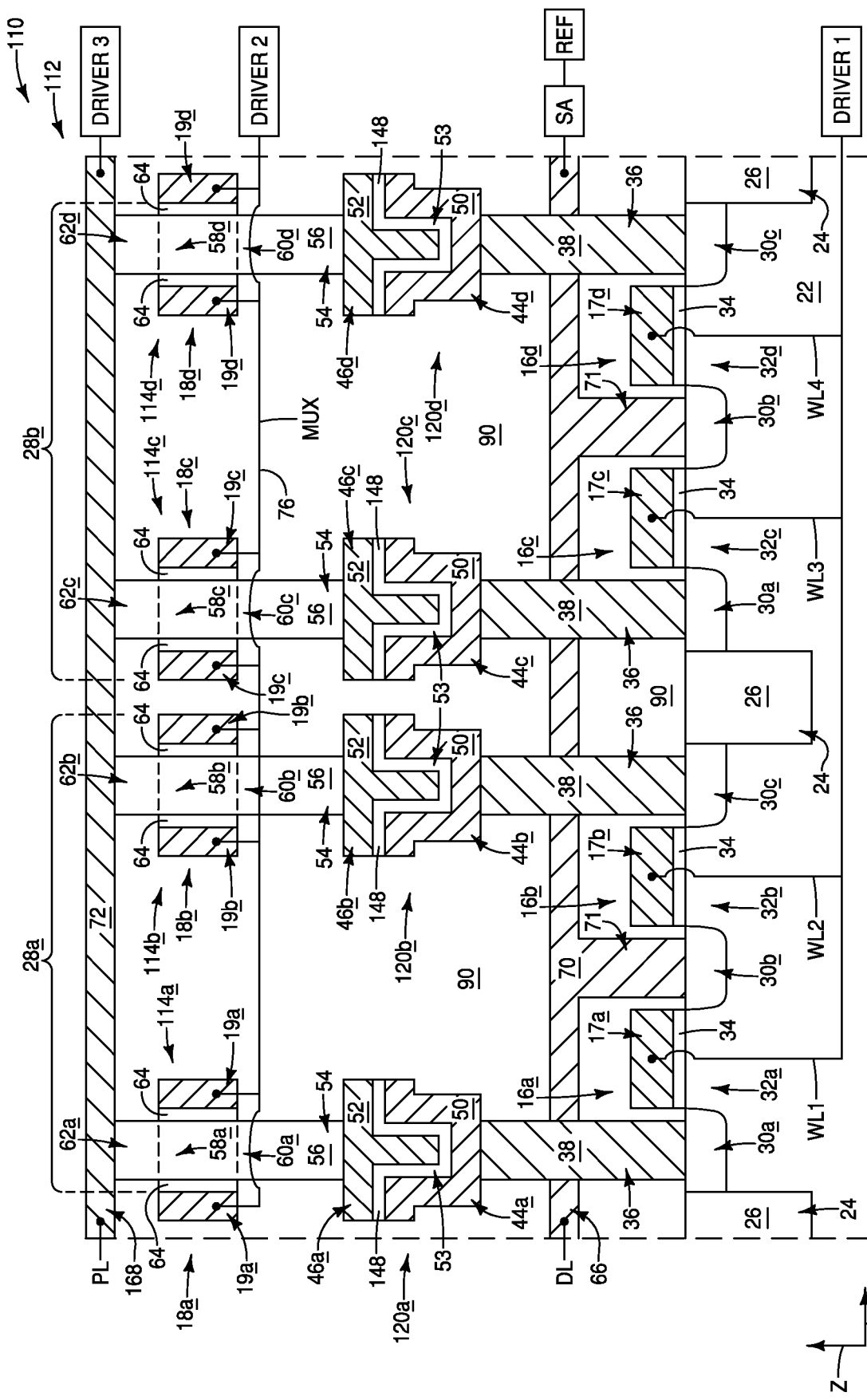
FIG. 4 is a diagrammatic cross-sectional side view of a region of an example integrated assembly comprising example ferroelectric memory devices.

FIG. 4 shows another example assembly 100 comprising another example memory array 112. Identical numbering will be used to describe the assembly 100 of FIG. 4 as was used to describe the assembly 10 of FIG. 2, where appropriate.

The assembly 100 includes the semiconductor base 22, and the insulative regions 24 extending into the base. The insulative regions 24 comprise the insulative material 26.

Memory cells 114a-d are supported by the base 22. The memory cells 114a-d of FIG. 4 are similar to the memory cells 14a-d of FIG. 2 in that they comprise the first and second transistors 16 and 18 (with the first transistors of the individual memory cells being labeled 16a-d, and the second transistors of the individual memory cells being labeled 18a-d). The first transistors 16a-d comprise the horizontally-extending channel regions 32a-d, respectively; and the second transistors 18a-d comprise the vertically-extending channel regions 58a-d. The transistors 16 may be referred to as horizontal transistors (or planar transistors) to reflect that they have the horizontally-extending channel regions, and the transistors 18 may be referred to as vertical transistors to reflect that they have the vertically-extending channel regions. The vertically-extending channel regions 58 may have about the same lengths as the horizontally-extending channel regions 32 as described above with reference to FIG. 2A; or may have different lengths than those of the horizontally-extending channel regions as described above with reference to FIG. 2B.

The planar transistors 16a-d comprise the transistor gates 17a-d, and the gate dielectric material 34. The transistor gates 17a-d are electrically coupled with wordlines (WL1-WL4). The wordlines are electrically connected with a driver (Driver 1), which may correspond to a wordline driver (i.e., row driver).

The vertical transistors 18a-d comprise the transistor gates 19a-d, and the gate dielectric material 64. The transistor gates 19a-d are electrically coupled with a conductive interconnect 76 which extends to another driver (Driver 2). The interconnect 76 may correspond to a mux (multiplexer) line. In the embodiment of FIG. 4, the mux line 76 extends along a same direction as the digit line 66 (i.e., a column direction). In other embodiments, the mux line may extend along the same direction as the wordlines (i.e., a row direction). The Driver 2 may be separate from the Driver 1 (i.e., may comprise separate circuitry from the Driver 1) or may be the same as the Driver 1.

Capacitors 120a-d are between the planar transistors (16a-d) and the vertical transistors (18a-d). The capacitors 120 comprise the bottom and top electrodes 44 and 46, with the bottom electrodes having the container-shape described above with reference to FIG. 2. The capacitors 120 of FIG. 4 are ferroelectric capacitors.

The ferroelectric capacitors 120 have ferroelectric material as at least part of an insulating material 148 provided between the electrodes 44 and 46. Ferroelectric materials are characterized by having two stable polarized states. The polarization state of the ferroelectric material can be changed by application of suitable programming voltages, and remains after removal of the programming voltage (at least for a time). The ferroelectric component of the insulative material 148 may comprise any suitable composition(s); and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, strontium, and a rare earth element. The ferroelectric material may be provided in any suitable configuration; such as, for example, a single homogeneous material, or a laminate of two or more discrete separate materials.

The memory cells (devices) 114 having the ferroelectric capacitors 120 therein may be considered to be ferroelectric memory cells (or ferroelectric memory devices).

The bottom electrodes 44 of the capacitors 120 are coupled with the source/drain regions 30a, 30c of the planar transistors 16 through the vertically-extending interconnects (conductive extensions) 36. The conductive extensions 36 comprise the conductive material 38 described previously with reference to FIG. 2.

The memory cells 114a-d are in paired arrangements analogous to the paired arrangements described above with reference to FIG. 2; with the memory cells 114a and 114b being in a first paired arrangement 28a, and with the memory cells 114c and 114d being in a second paired arrangement 28b. The first transistors 16a and 16b within the first paired arrangement 28a share a source/drain region 30b, and the first transistors 16c and 16d within the second paired arrangement 28b also share a source/drain region 30b. The transistor 16a has another source/drain region 30a on an opposing side of the channel region 32a relative to the source/drain region 30b; and the transistor 16b has another source/drain region 30c on an opposing side of the channel region 32b relative to the source/drain region 30b. Similarly, the transistors 16c and 16d have source/drain regions 30a and 30c, respectively.

The vertical transistors 18 have source/drain regions 60 and 62 on opposing sides of the channel regions 58. The source/drain regions 60, 62 of individual memory cells are labeled as 60a-d and 62a-d.

The regions 58, 60 and 62 of the vertical transistors 18 are within the semiconductor material 56 of the semiconductor pillars 54.

The shared source/drain regions 30b are electrically connected to a digit line 66 (labeled as DL) through a vertical interconnect (digit line connection) 71. The digit line 66 comprises the conductive material 70. The digit line DL extends to a sense amplifier SA and is comparatively coupled with a reference voltage REF. The reference voltage may be static, or may vary depending upon an operational mode of the memory cells 114 associated with the digit line DL. The reference voltage REF may be any suitable voltage; and in some embodiments may be within a range of from greater than 0 volts to less than or equal to the Vcc supply voltage.

The upper source/drain regions 62 of the vertical transistors 18 are coupled with a plate structure 168, which is labeled as PL. The plate structure 168 may correspond to a plate line. The plate structure 168 is electrically connected with a third driver (Driver 3). The third driver may be referred to as a plate driver.

In the illustrated embodiment, the plate line 168 extends along a same direction as the digit line 66 (i.e., a column direction). In other embodiments, the plate line may extend along the row direction (i.e., the same direction as the wordlines).

In some embodiments, the paired arrangement 28a may be considered to comprise first and second ferroelectric memory devices (cells, components) 114a and 114b. The first ferroelectric memory device 114a includes a first transistor 16a having a horizontally-extending first channel region 32a; and includes a second transistor 18a having a vertically-extending second channel region 58a. A first capacitor 120a is between the first and second transistors 16a and 18a. The second ferroelectric memory device 114b includes a third transistor 16b having a horizontally-extending third channel region 32b; and includes a fourth transistor 18b having a vertically-extending fourth channel region 58b. A second capacitor 120b is between the third and fourth transistors 16b and 18b.

The first transistor 16a has first and second source/drain regions 30a and 30b on opposing sides of its channel region 32a.

The second transistor 18a has third and fourth source/drain regions 60a and 62a on opposing sides of its channel region 58a.

The third transistor 16b has the second source/drain region 30b on one side of its channel region 32b; and has a fifth source/drain region 30c on an opposing side of its channel region 32b.

The fourth transistor 18b has sixth and seventh source/drain regions 60b and 62b on opposing sides of its channel region 58b.

The first and fifth source/drain regions 30a and 30c are electrically coupled with the bottom electrodes 44a and 44b of the first and second capacitors 120a and 120b, respectively. The third and sixth source/drain regions 60a and 60b are electrically coupled with the top electrodes 46a and 46b of the first and second capacitors 120a and 120b, respectively.

The first, second, third and fourth transistors 16a, 18a, 16b and 18b have first, second, third and fourth transistor gates 17a, 19a, 17b and 19b, respectively. Each of the transistor gates may be considered to be operatively adjacent to an associated channel region. For instance, the first transistor gate 17a may be considered to be operatively adjacent to the first channel region 32a in that the first transistor gate is positioned to apply a suitable electric field to induce carrier flow across the channel region 32a when the wordline WL1 is activated. As another example, the second transistor gate 19a may be considered to be operatively adjacent to the channel region 58a in that the transistor gate 19a is positioned to apply a suitable electric field to induce carrier flow across the channel region 58a when the mux line 76 is activated.

The digit line 66 is electrically connected with the second source/drain region 30b, and extends along a column of the memory array 112.

The wordlines WL1 and WL2 are electrically connected with the first and third transistor gates 17a and 17b, and extend along rows of the memory array 112.

The mux line 76 is electrically connected with the third and fourth transistor gates 19a and 19b. In the illustrated embodiment of FIG. 4, the same mux line is electrically connected with both the third transistor gate 19a and the fourth transistor gate 19b. In other embodiments, the third transistor gate 19a may be electrically connected with a different mux line than the fourth transistor gate 19b.

FIG. 4 shows that the plate line 168 is electrically connected with the fourth and seventh source/drain regions 62a and 62b. In the embodiment of FIG. 4, the same plate line is electrically connected to both the fourth source/drain region 62a and the seventh source/drain region 62b. In other embodiments the fourth source/drain region 62a may be electrically connected to a different plate line than the seventh source/drain region 62b.

The paired arrangement 28b has a similar configuration as that described above relative to the paired arrangement 28a; but utilizing the memory cells 114c and 114d instead of the memory cells 114a and 114b.

The memory cells 114a-114d may be considered to be substantially identical to one another; and may be considered to be representative of a large number of substantially identical memory cells which may be utilized in the memory array 112. For instance, the memory array 112 may comprise hundreds, thousands, hundreds of thousands, millions, hundreds of millions, etc., of the ferroelectric memory cells.

Insulative material 90 may extend between the memory cells 114a-d, under the digit line DL and over the plate line PL (although the material 90 is not shown over the plate line 168 of FIG. 4 in order to simplify the drawing). The insulative material 90 may comprise any suitable composition(s), such as, for example, silicon dioxide.

The mux lines, digit lines, plate lines and wordlines of the memory array 112 may be arranged in any suitable configuration. Example configurations are described with reference to FIGS. 5-10.

Figure 5:
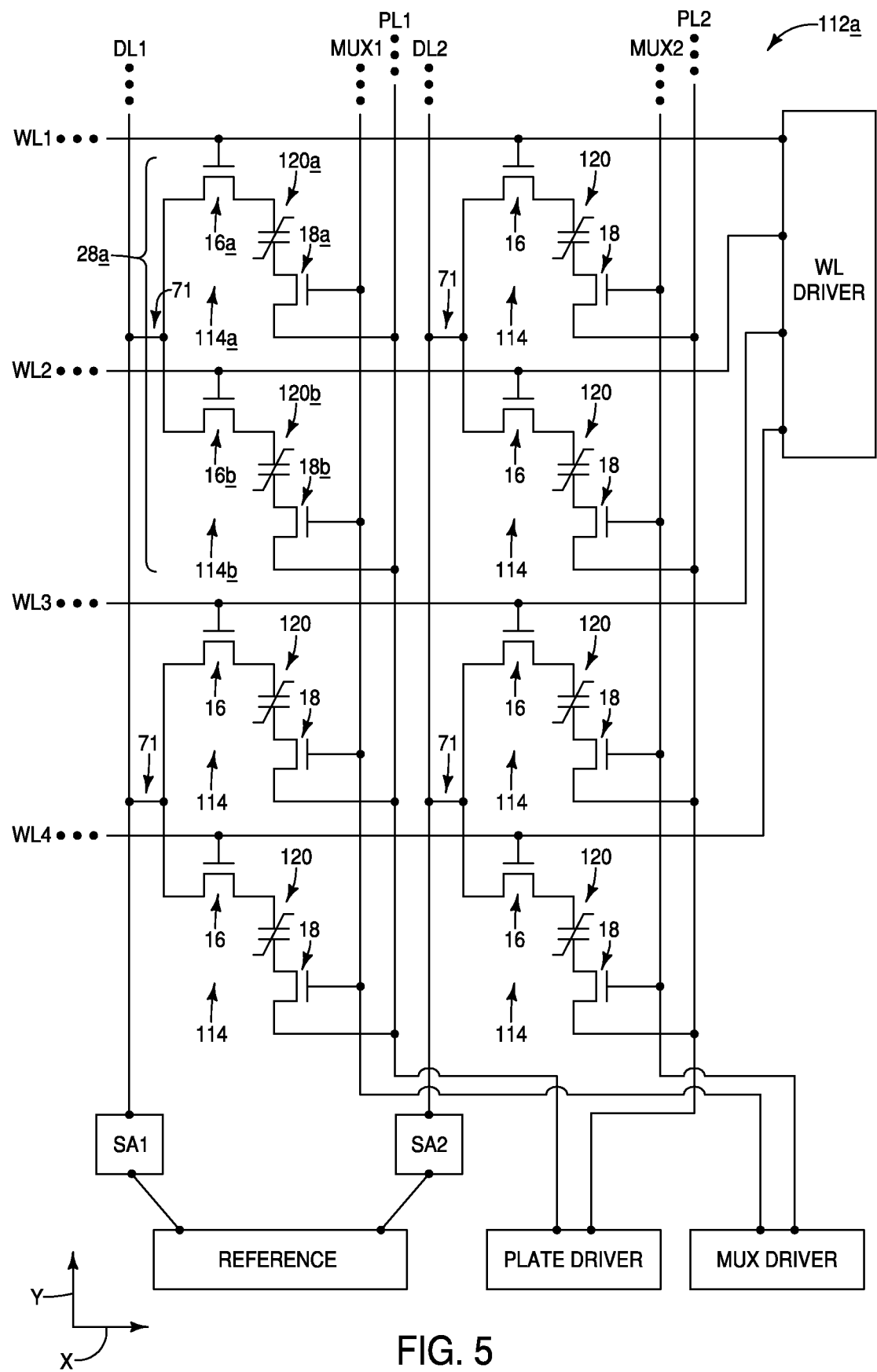
FIGS. 5-10 are diagrammatic schematic illustrations of regions of example assemblies comprising example memory arrays with example ferroelectric memory devices.

Referring to FIG. 5, a memory array 112a includes a plurality of memory cells 114. Two of the memory cells are labeled as 114a and 114b. The memory cells 114a and 114b are configured in the paired arrangement 28a described above with reference to FIG. 4.

The memory array 112a includes wordlines (WL1-WL4) extending along the row direction (i.e., the illustrated x-axis direction), and includes digit lines (DL1 and DL2) extending along the column direction (i.e., the illustrated y-axis direction). The memory array also includes mux lines (MUX1 and MUX2) extending along the column direction, and includes plate lines (PL1 and PL2) extending along the column direction. The wordlines (WL1-WL4) are electrically connected with a wordline driver (WL DRIVER), the plate lines (PL1 and PL2) are electrically connected with a PLATE DRIVER, and the mux lines (MUX1 and MUX2) are electrically connected with a MUX DRIVER. Also, the digit lines (DL1 and DL2) are electrically connected with sense amplifiers (SA1 and SA2), and are comparatively coupled to a reference voltage (REFERENCE) through the sense amplifiers. The reference voltage may be referred to as a reference source, a voltage source, etc.

In the illustrated embodiment of FIG. 5, the gates of the vertical transistors 18a and 18b of the first and second memory devices 114a are coupled to the same mux line (MUX1) as one another, and source/drain regions from the vertical transistors 18a and 18b extend to the same plate line PL1.

Figure 6:
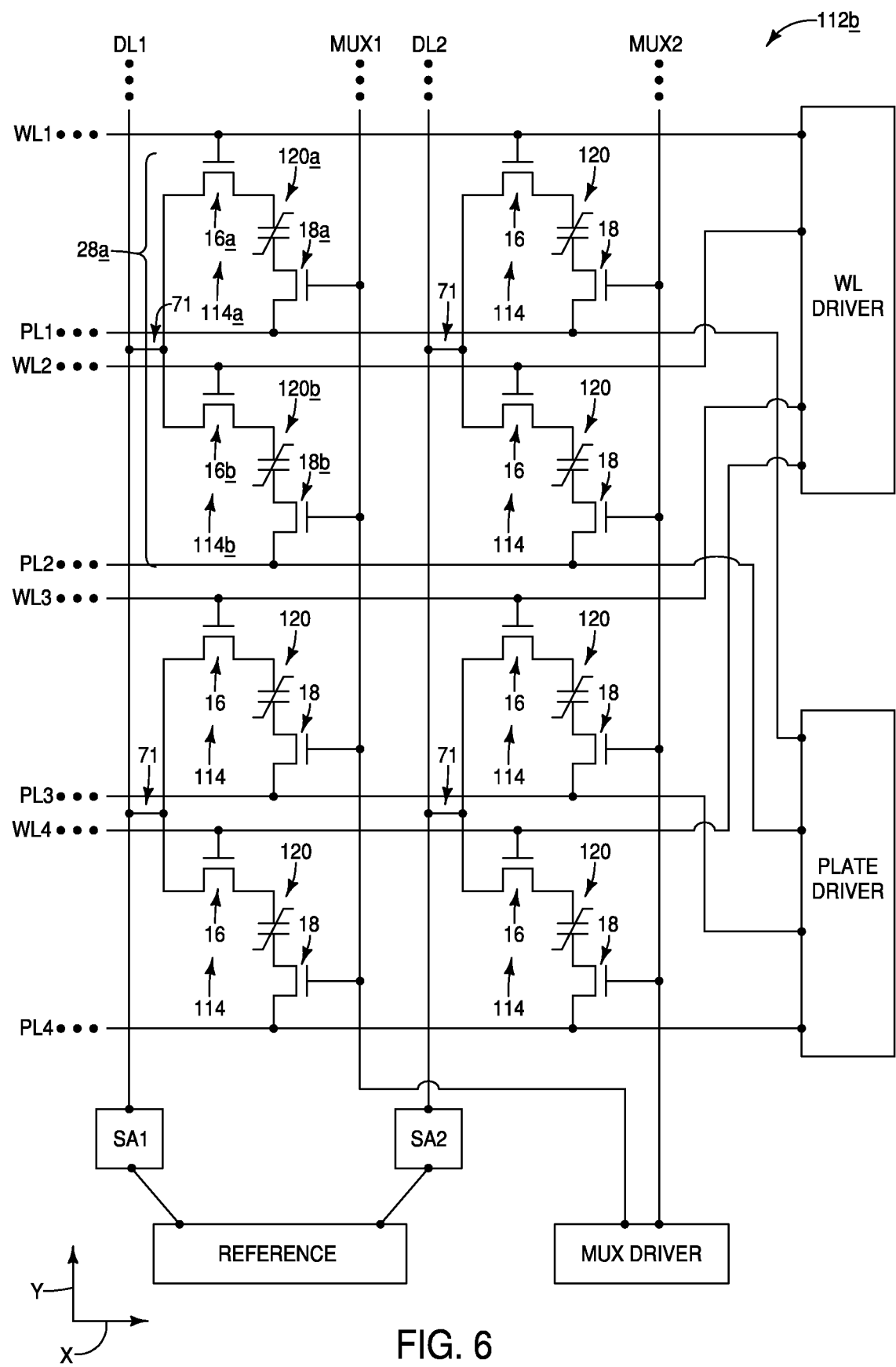

FIG. 6 shows a region of a memory array 112b illustrating another example embodiment. The mux lines (e.g., MUX1) extend along the column direction (i.e., the y-axis direction), but the plate lines (e.g., PL1) extend along the row direction (i.e., the x-axis direction). Accordingly, the gates of the vertical transistors 18a and 18b are electrically connected to the same mux line (MUX1) as one another; but the source/drain regions from such vertical transistors are electrically connected to different plate lines (PL1 and PL2) than one another. In some embodiments, the source/drain region from the first vertical transistor 18a may be considered to be electrically connected to a first plate line (PL1) while the source/drain region from the second vertical transistor 18b may be considered to be electrically connected to a second plate line (PL2).

Figure 7:
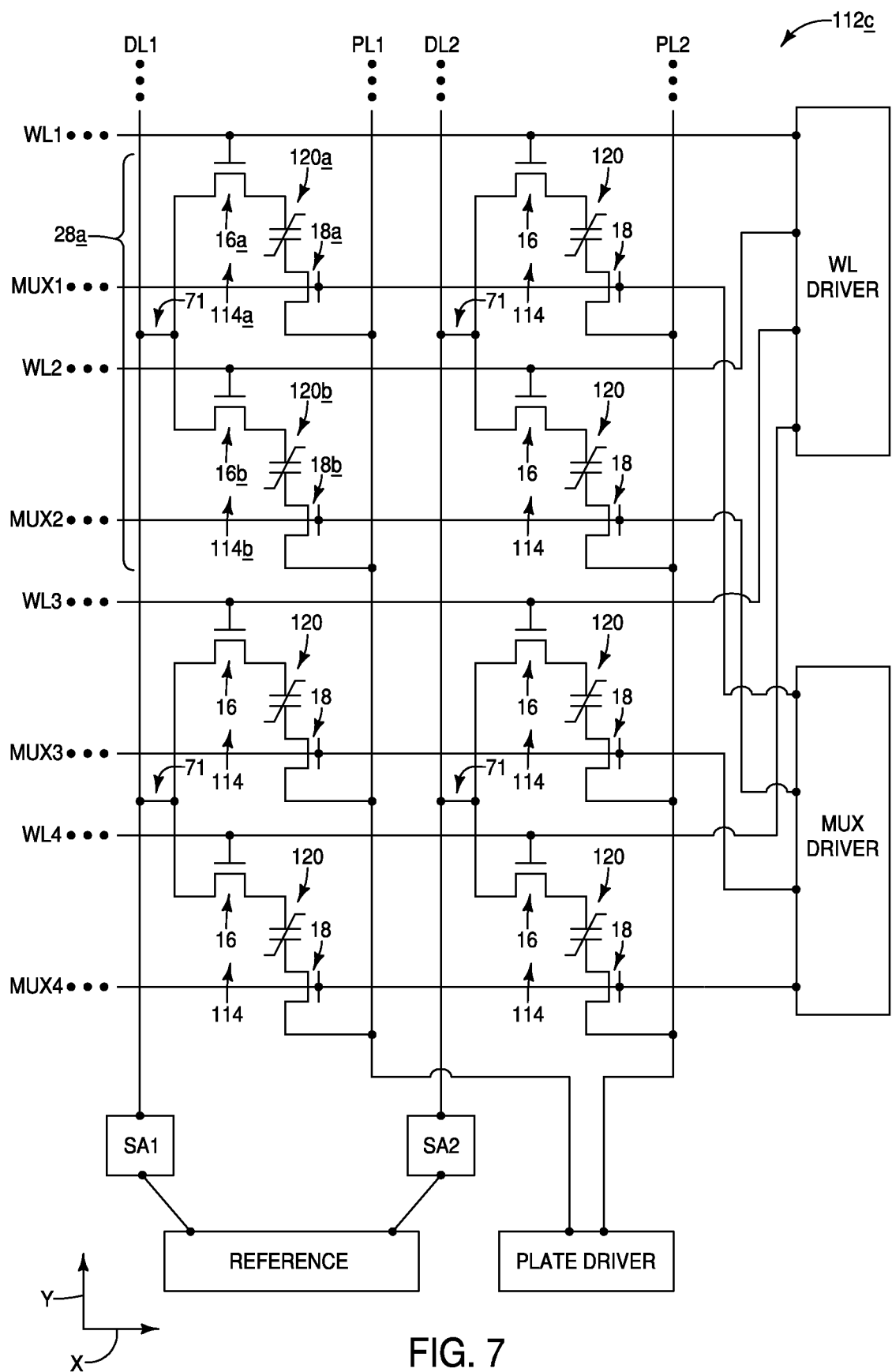

FIG. 7 shows a region of a memory array 112c illustrating another example embodiment. The mux lines (e.g., MUX1) extend along the row direction (i.e., the x-axis direction) and the plate lines (e.g., PL1) extend along the column direction (i.e., the y-axis direction). Accordingly, the gates of the vertical transistors 18a and 18b are electrically connected to different mux lines (MUX1 and MUX2) than one another; while the source/drain regions from such vertical transistors are electrically connected to the same plate line (PL1) as one another. In some embodiments, the gate from the first vertical transistor 18a may be considered to be electrically connected to a first mux line (MUX1) while the gate from the second vertical transistor 18b may be considered to be electrically connected to a second mux line (MUX2).

Figure 8:
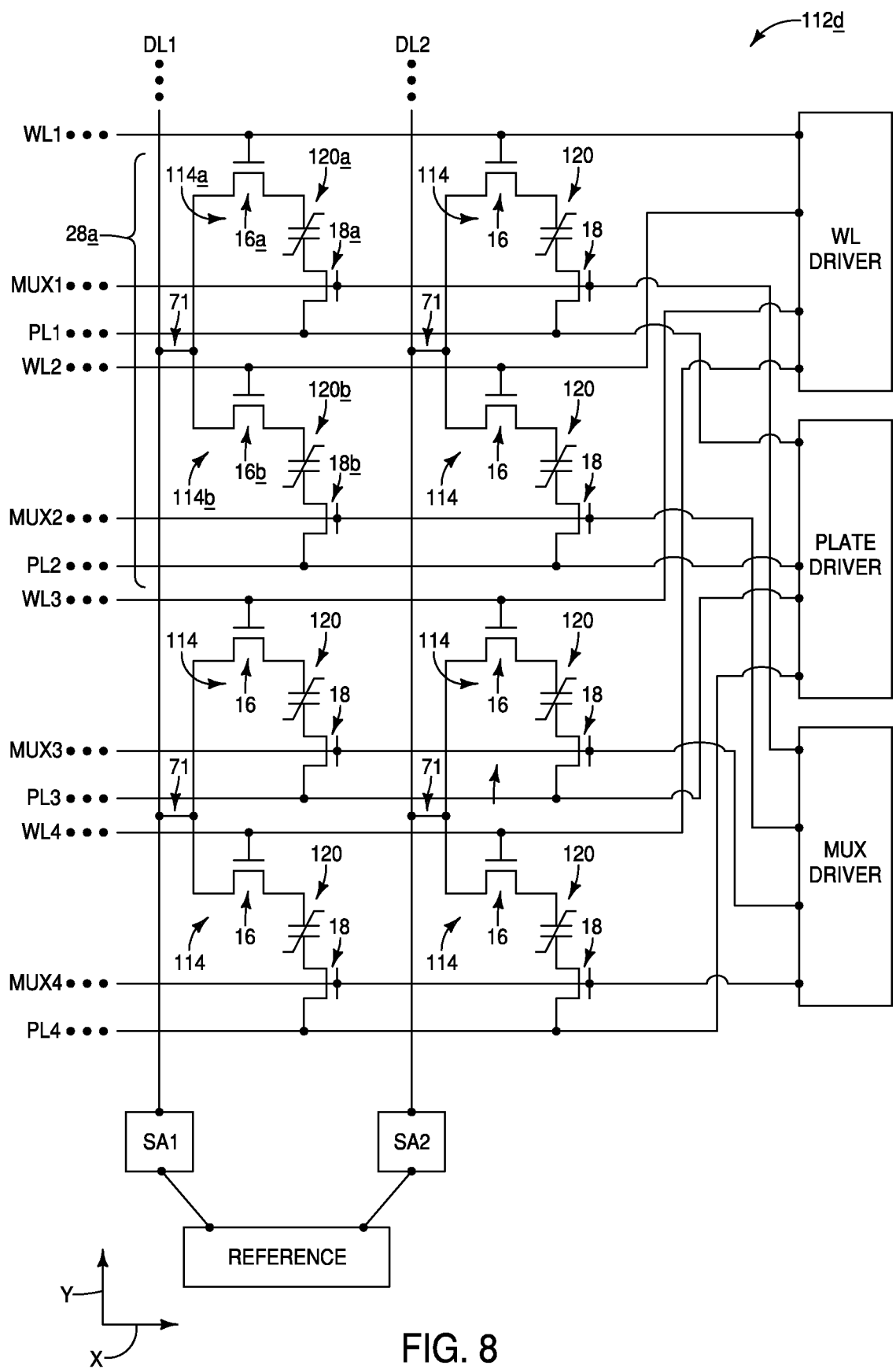

FIG. 8 shows a region of a memory array 112d illustrating another example embodiment. The mux lines (e.g., MUX1) extend along the row direction (i.e., the x-axis direction) and the plate lines (e.g., PL1) also extend along the row direction. Accordingly, the gates of the vertical transistors 18a and 18b are electrically connected to different mux lines (MUX1 and MUX2) than one another; and the source/drain regions from such vertical transistors are electrically connected to different plate lines (PL1 and PL2) than one another. In some embodiments, the gate from the first vertical transistor 18a may be considered to be electrically connected to a first mux line (MUX1) while the gate from the second vertical transistor 18b may be considered to be electrically connected to a second mux line (MUX2). Also, the source/drain region from the first vertical transistor 18a may be considered to be electrically connected to a first plate line (PL1) while the source/drain region from the second vertical transistor 18b may be considered to be electrically connected to a second plate line (PL2).

Figure 9:
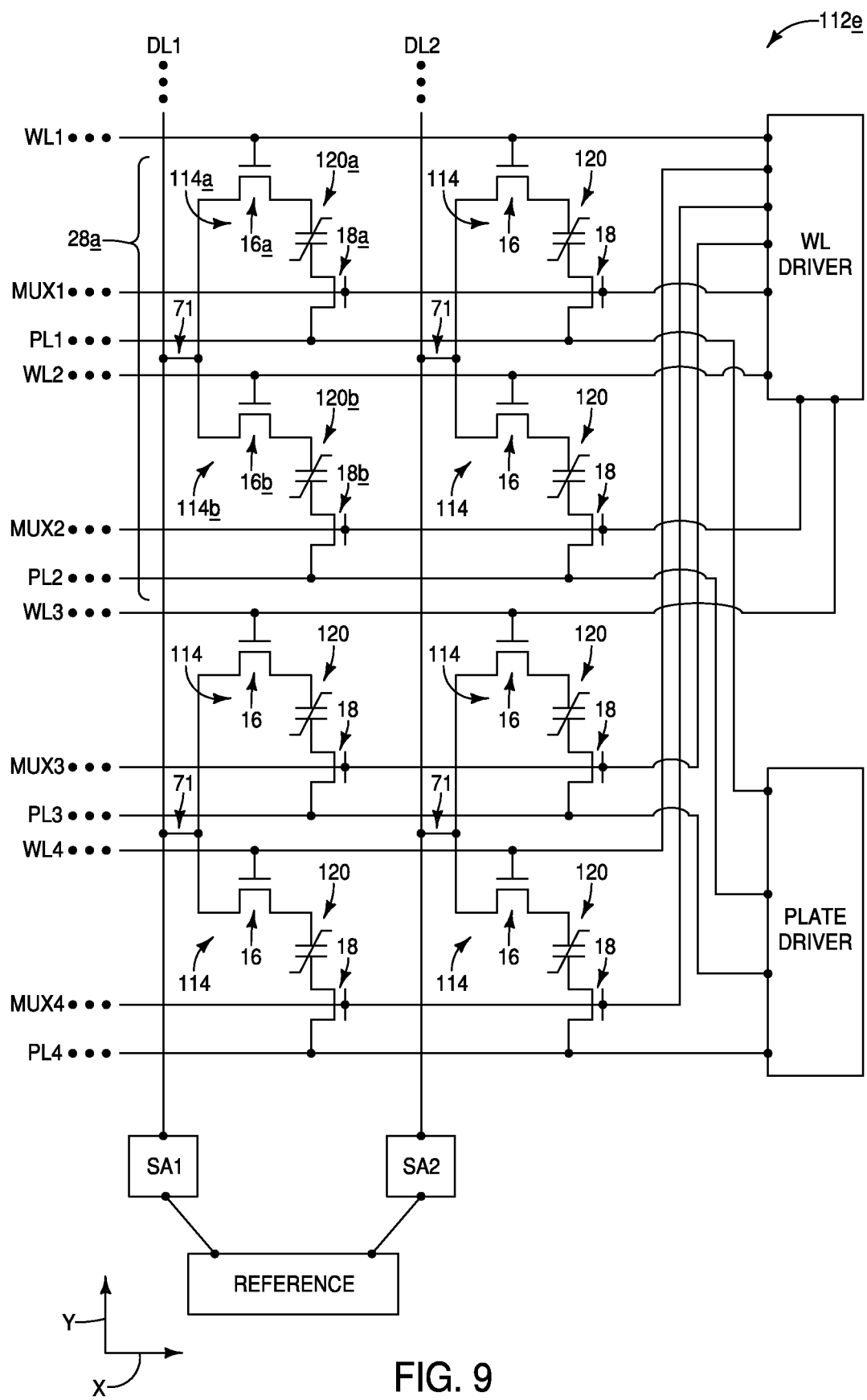

FIG. 9 shows a region of a memory array 112e illustrating another example embodiment. The mux lines (e.g., MUX1) extend along the row direction (i.e., the x-axis direction) and the plate lines (e.g., PL1) also extend along the row direction. The embodiment of FIG. 9 is similar to that of FIG. 8, except that the mux lines are shown extending to the same driver as the wordlines (the row driver, which is labeled as the WL DRIVER in FIG. 9). The embodiment of FIG. 8 may be preferred over that of FIG. 9 in some applications in that the additional driver (the MUX Driver) may provide additional operational control. However, in some applications the configuration of FIG. 9 may be preferred in that such may reduce the overall number of drivers fabricated adjacent a memory array.

Figure 10:
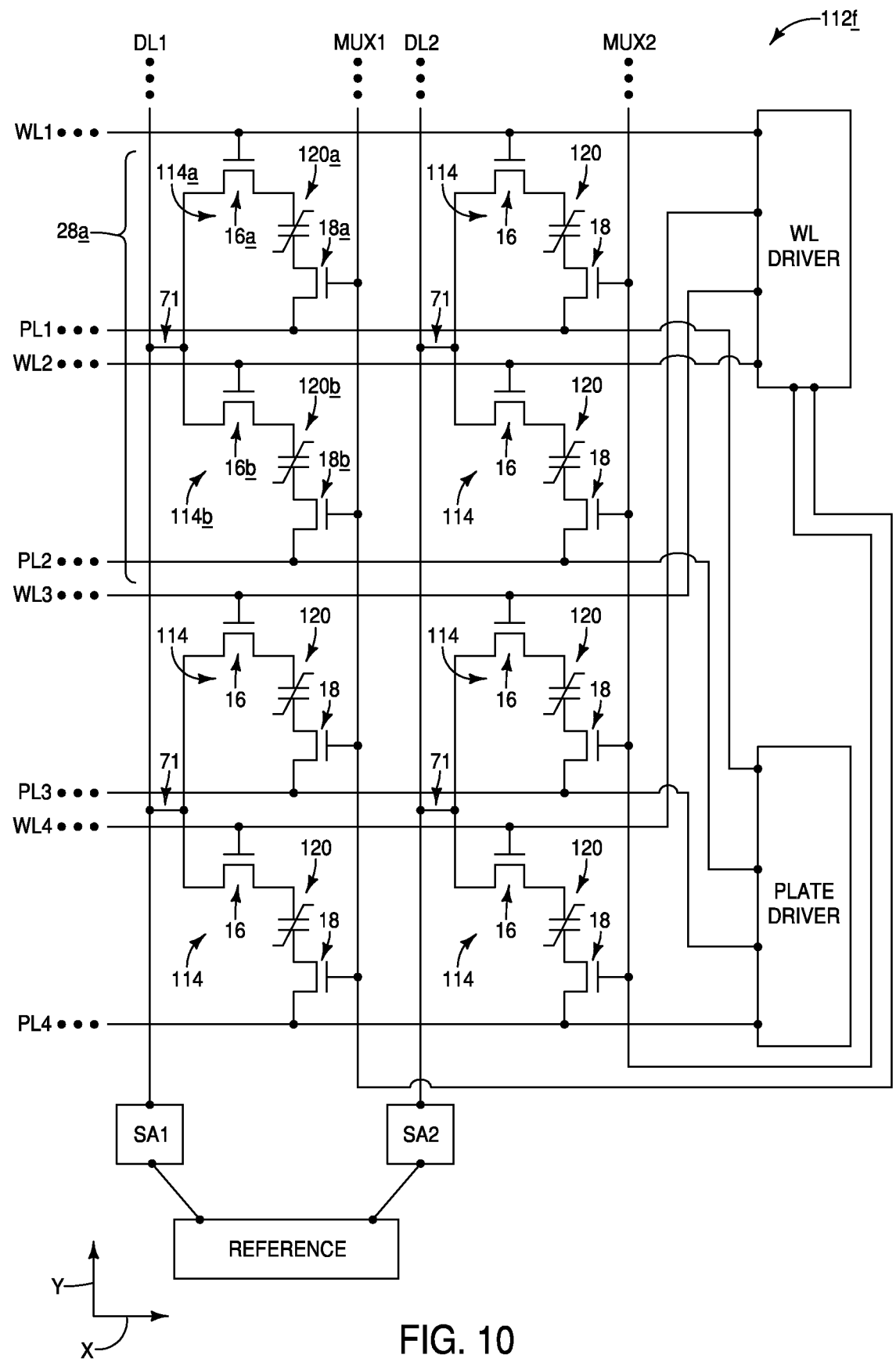

FIG. 10 shows a region of a memory array 112f illustrating another example embodiment. The mux lines (e.g., MUX1) extend along the column direction (i.e., the y-axis direction) and the plate lines (e.g., PL1) extend along the row direction (i.e., the x-axis direction). The embodiment of FIG. 10 is similar to that of FIG. 6, except that the mux lines are shown extending to the same driver as the wordlines (the row driver, which is labeled as the WL DRIVER in FIG. 10). The embodiment of FIG. 6 may be preferred over that of FIG. 10 in some applications in that the additional driver (the MUX Driver) may provide additional operational control. However, in some applications the configuration of FIG. 10 may be preferred in that such may reduce the overall number of drivers fabricated adjacent a memory array.

Figure 11:
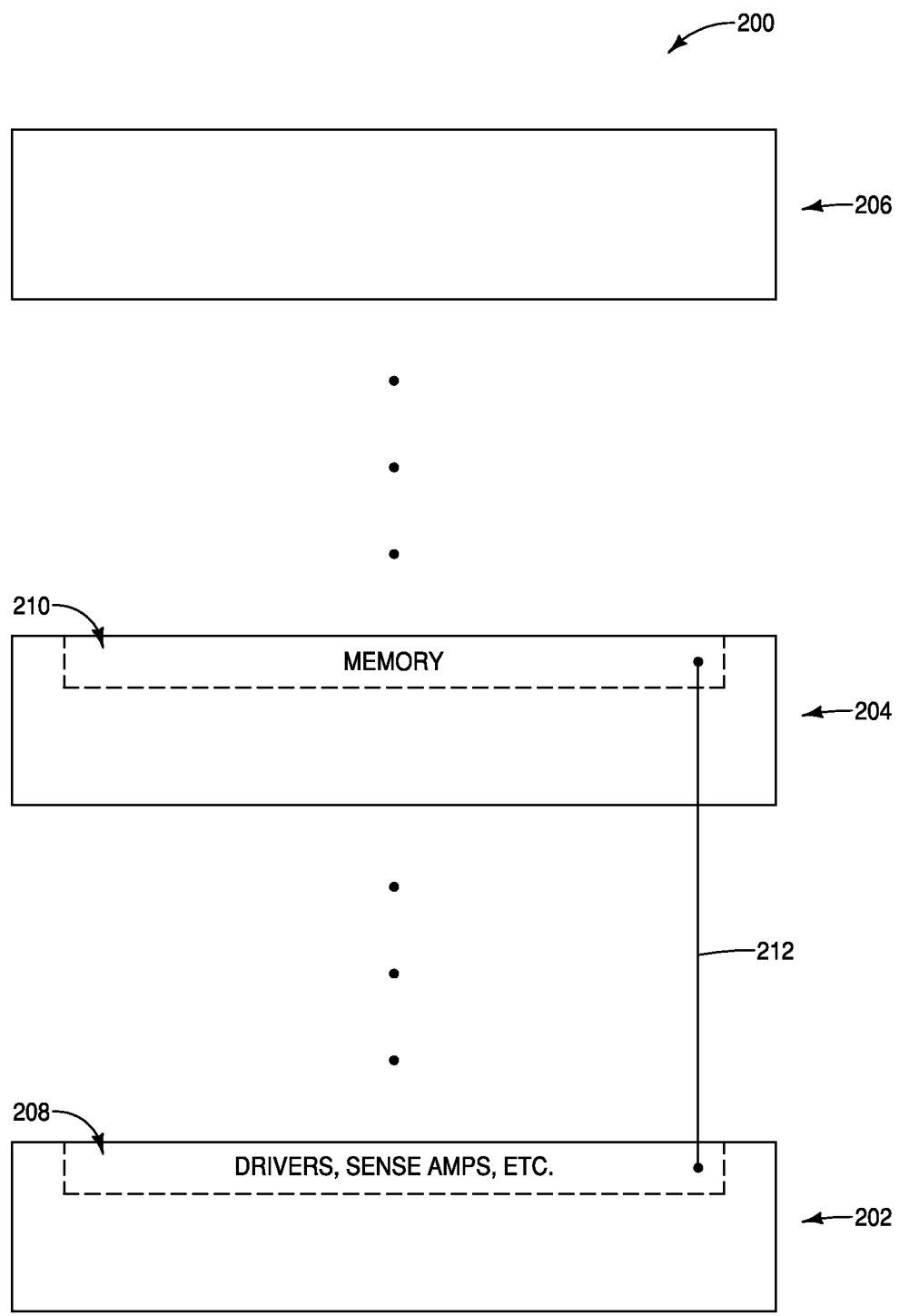
FIG. 11 is a diagrammatic cross-sectional side view of a region of an example multitier integrated assembly.

In some embodiments, the memory arrays (e.g., 12 and 112) may be within a memory tier (i.e., memory deck) which is within a vertically-stacked arrangement of tiers (or decks). The vertically-stacked arrangement may be referred to as a multitier assembly. FIG. 11 shows a portion of an example multitier assembly 200 comprising a vertically-stacked arrangement of tiers 202, 204 and 206. The vertically-stacked arrangement may extend upwardly to include additional tiers. The tiers 202, 204 and 206 may be considered to be examples of levels that are stacked one atop the other. The levels may be within different semiconductor dies, or at least two of the levels may be within the same semiconductor die.

The bottom tier 202 may include control circuitry and/or sensing circuitry 208 (e.g., may include drivers, sense amplifiers, etc.); and in some applications may comprise CMOS circuitry. The upper tiers 204 and 206 may include memory arrays, such as, for example, the memory arrays 12 and 112 described above; with an example memory array being shown as "memory" 210 within the tier 204.

The circuitry from the upper tiers may be electrically connected to the circuitry of the lower tiers through electrical interconnects. An example electrical interconnect 212 is shown electrically coupling the memory circuitry 210 from the tier 204 with the circuitry 208 of the tier 202. In some embodiments, the interconnect 212 may connect digit lines from the memory circuitry 210 with sense amplifiers of the circuitry 208, may connect wordlines, mux lines and/or plate lines of the memory circuitry 210 with drivers of the circuitry 208, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly with a first transistor having a horizontally-extending channel region between a first source/drain region and a second source/drain region, and with a second transistor having a vertically-extending channel region between a third source/drain region and a fourth source/drain region. A capacitor has a first electrode, a second electrode, and an insulative material between the first and second electrodes. The first electrode is electrically connected with the first source/drain region and the second electrode is electrically connected with the third source/drain region. A digit line is electrically connected with the second source/drain region. A conductive structure is electrically connected with the fourth source/drain region.

Some embodiments include integrated memory having two-transistor-one-capacitor (2T-1C) memory devices. The 2T-1C memory devices are in paired arrangements, with each paired arrangement comprising a first 2T-1C memory device and a second 2T-1C memory device. The first 2T-1C memory devices each includes a first transistor having a horizontally-extending channel region, a second transistor having a vertically-extending channel region, and a first capacitor between the first and second transistors. The second 2T-1C memory devices each includes a third transistor having a horizontally-extending channel region, a fourth transistor having a vertically-extending channel region, and a second capacitor between the third and fourth transistors. Each of the first transistors has first and second source/drain regions on opposing sides of its channel region. Each of the second transistors has third and fourth source/drain regions on opposing sides of its channel region. Each of the third transistors has a fifth source/drain region on one side of its channel region, and has the second source/drain region on an opposing side of its channel region. Each of the fourth transistors has sixth and seventh source/drain regions on opposing sides of its channel region. The first and fifth source/drain regions are electrically coupled with the first and second capacitors, respectively. The third and sixth source/drain regions are electrically coupled with the first and second capacitors, respectively. First comparative digit lines are electrically connected with the second source/drain regions. Second comparative digit lines are electrically connected with the fourth and seventh source/drain regions. The first and second comparative digit lines are comparatively coupled to one another through sense amplifiers.

Some embodiments include integrated memory having ferroelectric memory devices within a memory array. The ferroelectric memory devices are in paired arrangements. Each paired arrangement comprises a first ferroelectric memory device and a second ferroelectric memory device. Each of the first ferroelectric memory devices includes a first transistor having a horizontally-extending first channel region, a second transistor having a vertically-extending second channel region, and a first capacitor between the first and second transistors. Each of the second ferroelectric memory devices includes a third transistor having a horizontally-extending third channel region, a fourth transistor having a vertically-extending fourth channel region, and a second capacitor between the third and fourth transistors. Each of the first transistors has first and second source/drain region on opposing sides of its channel region. Each of the second transistors has third and fourth source/drain regions on opposing sides of its channel region. Each of the third transistors has a fifth source/drain region on one side of its channel region, and has the second source/drain region on an opposing side of its channel region. Each of the fourth transistors has sixth and seventh source/drain regions on opposing sides of its channel region. The first and fifth source/drain regions are electrically coupled with the first and second capacitors, respectively. The third and sixth source/drain regions are electrically coupled with the first and second capacitors, respectively. The first, second, third and fourth transistors have first, second, third and fourth transistor gates, respectively, which are operatively adjacent to the first, second, third and fourth channel regions, respectively. Digit lines are electrically connected with the second source/drain regions, and extend along columns of the memory array. Wordlines are electrically connected with the first and third transistor gates, and extend along rows of the memory array. MUX lines are electrically connected with the second and fourth transistor gates. Plate lines are electrically connected with the fourth and seventh source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. Integrated memory, comprising:
two-transistor-one-capacitor (2T-1C) memory devices; the 2T-1C memory devices being in paired arrangements, with each paired arrangement comprising a first 2T-1C memory device and a second 2T-1C memory device; the first 2T-1C memory devices each including a first transistor having a horizontally-extending channel region, a second transistor having a vertically-extending channel region, and a first capacitor between the first and second transistors; the second 2T-1C memory devices each including a third transistor having a horizontally-extending channel region, a fourth transistor having a vertically-extending channel region, and a second capacitor between the third and fourth transistors; each of the first transistors having first and second source/drain regions on opposing sides of its channel region; each of the second transistors having third and fourth source/drain regions on opposing sides of its channel region with the vertically-extending channel region, the third source/drain region and the fourth source/drain region being disposed within a semiconductor pillar; each of the third transistors having a fifth source/drain region on one side of its channel region, and having the second source/drain region on an opposing side of its channel region; each of the fourth transistors having sixth and seventh source/drain regions on opposing sides of its channel region; the first and fifth source/drain regions being electrically coupled with the first and second capacitors, respectively; the third and sixth source/drain regions being electrically coupled with the first and second capacitors, respectively, the first capacitor having an electrode in direct physical contact with the semiconductor pillar;
first comparative digit lines electrically connected with the second source/drain regions;
second comparative digit lines electrically connected with the fourth and seventh source/drain regions; and
the first and second comparative digit lines being comparatively coupled to one another through sense amplifiers.

2. The integrated memory of claim 1 wherein:
each of the first capacitors has a first bottom electrode electrically connected with the first source/drain region, has a first top electrode electrically connected with the third source/drain region, and has a first dielectric material between the first bottom electrode and the first top electrode; and
each of the second capacitors has a second bottom electrode electrically connected with the fifth source/drain region, has a second top electrode electrically connected with the sixth source/drain region, and has a second dielectric material between the second bottom electrode and the second top electrode.

3. The integrated memory of claim 2 wherein:
the first and second bottom electrodes are configured as first and second container-shaped structures having first and second upwardly-opening containers comprised thereby;
the first and second dielectric materials extend into the first and second upwardly-opening containers, respectively; and
the first and second top electrodes extend into the first and second upwardly-opening containers, respectively.

4. The integrated memory of claim 1 wherein the vertically-extending channel regions are about the same lengths as the horizontally-extending channel regions.

5. The integrated memory of claim 1 wherein the vertically-extending channel regions are not about the same lengths as the horizontally-extending channel regions.

6. The integrated memory of claim 1 being within a tier of a multitier assembly.

* * * * *